US009810722B2

(12) United States Patent
Schulz et al.

(10) Patent No.: US 9,810,722 B2
(45) Date of Patent: *Nov. 7, 2017

(54) DUAL GAP CURRENT SENSOR FOR MULTI PHASE CONDUCTION SYSTEM

(71) Applicant: Faraday & Future Inc., Gardena, CA (US)

(72) Inventors: Steven E. Schulz, Torrance, CA (US); Young Mok Doo, La Palma, CA (US); Silva Hiti, Redondo Beach, CA (US); Richard Michael Breese, Los Angeles, CA (US)

(73) Assignee: FARADAY & FUTURE INC., Gardena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/863,209

(22) Filed: Sep. 23, 2015

(65) Prior Publication Data

US 2017/0082660 A1  Mar. 23, 2017

(51) Int. Cl.
*G01R 31/40* (2014.01)
*G01R 15/20* (2006.01)
(Continued)

(52) U.S. Cl.
CPC ......... *G01R 15/202* (2013.01); *G01R 15/207* (2013.01); *G01R 19/0092* (2013.01);
(Continued)

(58) Field of Classification Search
CPC ... G01R 15/202; G01R 31/40; G01R 19/0092
(Continued)

(56) References Cited

U.S. PATENT DOCUMENTS 4,767,989 A * 8/1988 Meyer ................... G01D 5/147
174/541
4,914,412 A * 4/1990 Engdahl ................. H01L 41/12
335/215
(Continued)

FOREIGN PATENT DOCUMENTS

CA    1 010 503      5/1977
JP    2008-145352    6/2008
(Continued)

OTHER PUBLICATIONS

International Search Report and Written Opinion dated Jun. 28, 2016 in PCT/US2015/064782.

*Primary Examiner* — Giovanni Astacio-Oquendo
(74) *Attorney, Agent, or Firm* — Knobbe, Martens, Olson & Bear LLP

(57) ABSTRACT

A three-phase current sensor for measuring currents running in three conductors of a three-phase conductor system includes at least a first magnetic measuring device. The magnetic measuring device includes a magnetic circuit provided with at least two gaps and a magnetic field sensor arranged in each gap of the magnetic circuit. The magnetic field sensors are positioned on both sides of a cavity sized to receive one of the three conductors. The gaps and thus the magnetic field sensors are positioned such that stray magnetic flux from an adjacent conductor has substantially equal amplitude passing through each of the sensors.

16 Claims, 6 Drawing Sheets

(51) Int. Cl.
*G01R 19/00* (2006.01)
*G01R 19/25* (2006.01)
*G01R 35/00* (2006.01)

(52) U.S. Cl.
CPC ......... *G01R 19/2513* (2013.01); *G01R 31/40* (2013.01); *G01R 35/00* (2013.01)

(58) Field of Classification Search
USPC .................................. 324/764.01, 500, 537
See application file for complete search history.

(56) References Cited

U.S. PATENT DOCUMENTS

| | | | | |
|---|---|---|---|---|
| 5,517,112 A * | 5/1996 | Vig | ........................ | G01D 3/032 307/116 |
| 6,937,003 B2 * | 8/2005 | Bowman | ................. | G01R 15/14 324/117 R |
| 7,774,148 B2 * | 8/2010 | Welchko | ................. | H02P 23/14 310/156.01 |
| 7,821,252 B2 | 10/2010 | Lepine | | |
| 8,054,084 B2 * | 11/2011 | Schulz | ................. | G01R 31/346 324/545 |
| 8,278,933 B2 * | 10/2012 | Welchko | ............ | G05B 23/0235 324/503 |
| 2002/0180417 A1 * | 12/2002 | Colby | ................... | G01R 15/18 324/117 R |
| 2004/0251928 A1 * | 12/2004 | Taguchi | ................. | H02K 11/048 324/117 R |
| 2006/0061920 A1 * | 3/2006 | Chun Lam | ................ | H01H 9/56 361/2 |
| 2006/0082357 A1 | 4/2006 | Tsukamoto | | |
| 2009/0121704 A1 | 5/2009 | Shibahara | | |
| 2013/0162245 A1 | 6/2013 | Tamura | | |
| 2014/0009146 A1 | 1/2014 | Blagojevic | | |
| 2014/0184212 A1 | 7/2014 | Yamaguchi | | |
| 2014/0253100 A1 | 9/2014 | Lepine | | |

FOREIGN PATENT DOCUMENTS

JP         5 688572        3/2015
JP            5688572 B2 *  3/2015

* cited by examiner

DUAL GAP CURRENT SENSOR FOR MULTI PHASE CONDUCTION SYSTEM

TECHNICAL FIELD

The systems and methods disclosed herein are directed to electric current sensors, and, more particularly, to sensors for measuring electric currents in a three-phase electrical conduction system.

BACKGROUND

Open loop current sensors typically include a magnetic field sensor mounted in the air gap of a magnetic core. A conductor passing through the magnetic core produces a magnetic field comparable to the current. The magnetic field is concentrated by the core and measured by the magnetic field sensor. The current sensor typically amplifies the signal from the magnetic field sensor, and it is this amplified signal that is the output of the sensor. A commonly used magnetic field sensor is a Hall Effect sensor integrated into an ASIC with terminals for its connection to a printed circuit for processing the signals. Open-loop current sensors can also have circuitry that provides temperature compensation and calibrated high-level voltage output.

In three-phase conduction systems, electric current may be measured by positioning sensors around two of the three phases, based on the assumption that the sum of the currents of the three conductors is zero. However, a current sensor can be placed around each of the three conductors, for example to detect possible leakage currents.

SUMMARY

One aspect relates to a power supply system comprising at least two output conductors, the output conductors defining substantially parallel longitudinal axes which in turn define a plane; a current sensor positioned around a first conductor of the at least two conductors and comprising a central aperture through which the first conductor extends, a first magnetic field detector, and a second magnetic field detector, wherein the first and second magnetic field detectors are positioned on opposite sides of the plane defined by the longitudinal axes of the at least two output conductors; and a fault detector configured to compare data generated at least in part by the first and second magnetic field detectors.

One aspect relates to a current sensing system for measuring currents flowing in a three-phase conduction system, the current sensing system comprising a first magnetic circuit comprising a first circuit portion and a second circuit portion positioned around a first conductor, the first circuit portion and the second circuit portion separated by a first gap and a second gap on opposing sides of the first conductor in a direction perpendicular to a longitudinal axis of the first conductor; a first pair of magnetic field detectors, one of the first pair of magnetic field detectors disposed in the first gap and the other of the first pair of magnetic field detectors disposed in the second gap; a second magnetic circuit comprising a third circuit portion and a fourth circuit portion positioned around a second conductor, the third circuit portion and the fourth circuit portion separated by a third gap and a fourth gap on opposing sides of the second conductor in a direction perpendicular to a longitudinal axis of the second conductor; a second pair of magnetic field detectors, one of the second pair of magnetic field detectors disposed in the third gap and the other of the second pair of magnetic field detectors disposed in the fourth gap; wherein no magnetic field detector is positioned directly between the first conductor and the second conductor; and a fault detection circuit in data communication with the first and second pairs of magnetic field detectors One aspect relates to a current sensing system for measuring currents flowing in a three-phase conduction system, the current sensing system comprising a magnetic circuit comprising a first circuit portion and a second circuit portion positioned around a first conductor, the first conductor located within proximity to a second conductor such that magnetic flux of the second conductor flows through the magnetic circuit; a first gap and a second gap separating the first circuit portion and the second circuit portion, the first gap and the second gap positioned on opposing sides of the first conductor; a pair of magnetic field detectors, one of the pair of magnetic field detectors disposed in the first gap and the other of the first pair of magnetic field detectors disposed in the second gap, the first gap and the second gap oriented relative to the second conductor such that substantially the same amplitude of the magnetic flux of the second conductor flows through each magnetic field detector of the pair of magnetic field detectors; and a fault detection circuit in data communication with the pair of magnetic field detectors.

BRIEF DESCRIPTION OF THE DRAWINGS

The disclosed aspects will hereinafter be described in conjunction with the appended drawings and appendices, provided to illustrate and not to limit the disclosed aspects, wherein like designations denote like elements.

DETAILED DESCRIPTION

Figure 1:
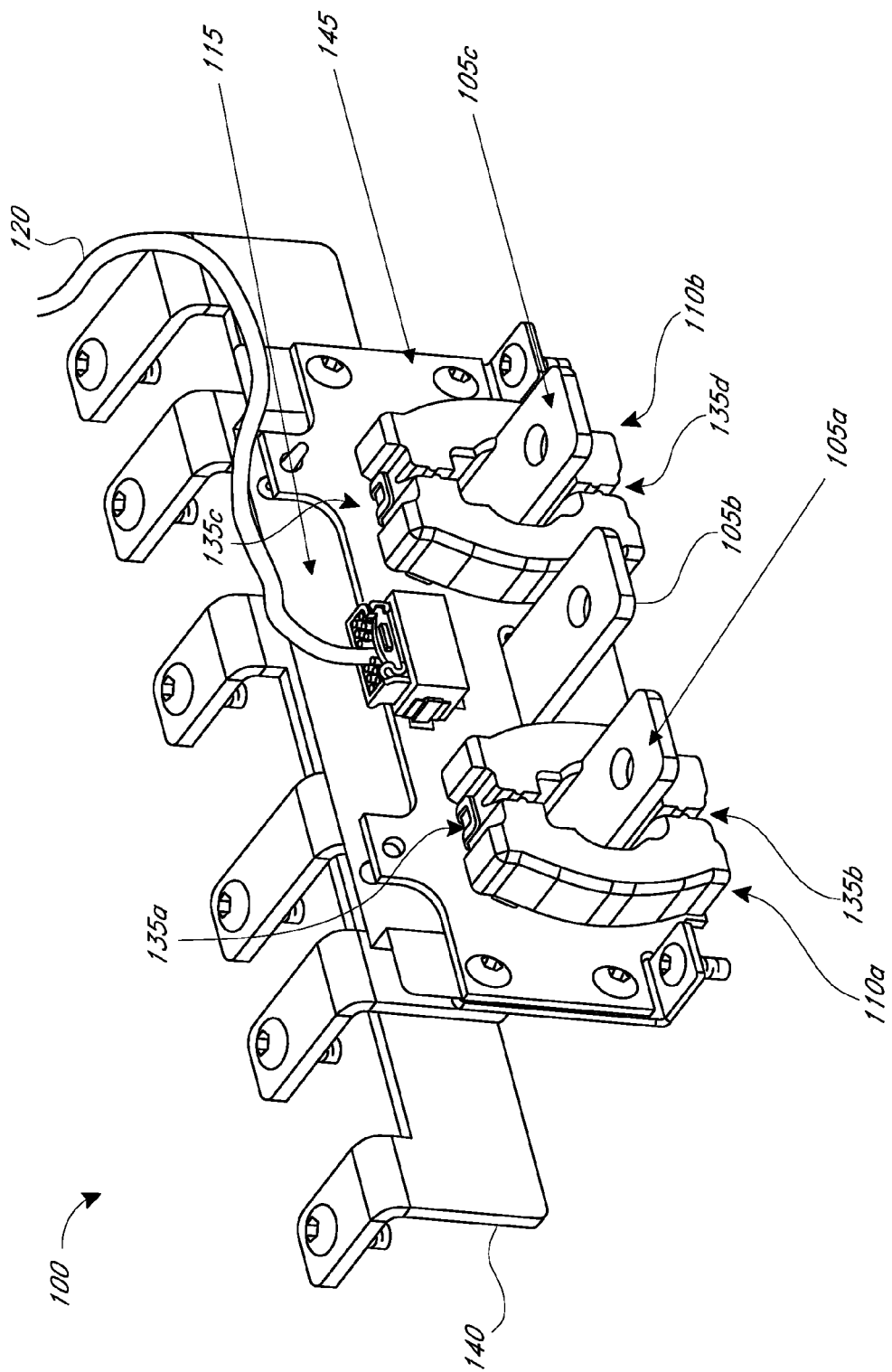
FIG. 1 illustrates an example three-phase conduction system having dual gap current sensors as described herein.

Embodiments of the disclosure relate to systems and techniques for using a dual-gap current sensor in a multi-phase conduction system while minimizing or eliminating error due to stray magnetic fields.

Many current sensors employ a Hall Effect sensor and magnetic core to sense the current flowing through a conductor. The magnetic core is placed around the current carrying conductor and concentrates the conductor's magnetic field. One or more gaps are introduced into the magnetic core and a Hall Effect element is placed in each gap, with conventional sensors having a C-shaped core with a single gap. In order to measure very large currents while avoiding magnetic saturation, the cross sectional area of the core can be increased to reduce the flux density in the magnetic material of the core. However, this can have the adverse effect of increasing the size and weight of the current sensor. Alternatively, multiple gaps can be introduced into the core structure (referred to as dual gap sensor). The latter offers the possibility of a small, low cost sensor.

While the dual gap structure provides advantages for size, weight, and cost relative to C-shaped or single gap cores, existing dual gap current sensors suffer from several drawbacks. For example, the dual gap structure is inherently more susceptible to stray magnetic fields. In applications where sensors must be located in close proximity to multiple current carrying conductors, stray fields can result in unwanted distortion and errors in the signal one is trying to measure. In the application to three phase AC motor drive, this can be particularly problematic. Such stray-field distortion can be exacerbated in the application to electric and/or hybrid vehicles, as the inverter packaging must be small and dense, resulting in close spacing of the sensors and adjacent phase current carrying conductors.

The aforementioned problems, among others, are addressed in some embodiments by the disclosed dual-gap current sensor design with improved accuracy, for example for use in high density motor drive inverter packages. One example pertains to a current sensor for measuring currents running in one or more conductors of a three-phase conductor system via at least one magnetic measuring device. The current sensor can include a magnetic circuit provided with at least two gaps and a magnetic field sensor arranged in each gap of the magnetic circuit. The magnetic field sensors can be positioned on both sides of a cavity sized to receive one of the conductors. The gaps and thus the magnetic field sensors can be positioned such that stray magnetic flux from an adjacent conductor has substantially equal amplitude passing through each of the sensors.

In conventional current sensor designs (refer to FIG. 3 below), the Hall effect sensors and gaps of each current sensor may be positioned in the same plane/axis as the output terminals. As mentioned above, such designs can cause large cross-coupling effect between the sensors. Previous approaches attempt to mitigate the cross coupling effects by performing compensatory data processing on the received sensor data, for example by individually calibrating the coupling coefficient of each adjacent conductor to the Hall effect sensor, storing such coupling coefficients, and then using the coupling coefficients to compute an estimate of the actual current based upon the measured values. This theoretically may work well for a conduction system having infinitely long and parallel bus bars, but may be complex or even not possible to achieve with more complicated three-dimensional bus bar structures.

The present disclosure proposes an alternate solution which minimizes the cross coupling effects such that an accurate measurement of the intended current can be obtained with minimal error and distortion.

One embodiment relates to a current sensor system for usage with a three-phase inverter, the current sensor system including two current sensors mounted on phase 1 and phase 3 of the inverter output terminals. Each of the two current sensors can include two Hall effect sensors (or other magnetic field sensors) and two magnetic circuits. The magnetic circuits of each current sensor are separated by two gaps, and one Hall Effect sensor can be disposed within each gap. In one example, the output terminals of the inverter can be arranged on the same plane/axis. The current sensors can be positioned so that the gaps and Hall Effect sensors of each current sensor are aligned in a direction perpendicular to the plane/axis of the output terminals.

The design minimizes the coupling to adjacent phase co-planar bus bar conductor, and reduces imbalance, thereby improving measurement. Three advantages can be realized. Firstly, the stray fields of adjacent conductors can become nearly orthogonal to the two Hall effect sensors, thus minimizing the resultant measurement pick-up. Secondly, the distance of each Hall cell to adjacent conductors can be equalized, so any unintended effect will be same on both sensors. Thirdly, the magnetic core can now be situated to shunt away the unwanted stray fields from the Hall effect sensor.

Various embodiments will be described below in conjunction with the drawings for purposes of illustration. It should be appreciated that many other implementations of the disclosed concepts are possible, and various advantages can be achieved with the disclosed implementations.

Figure 2:
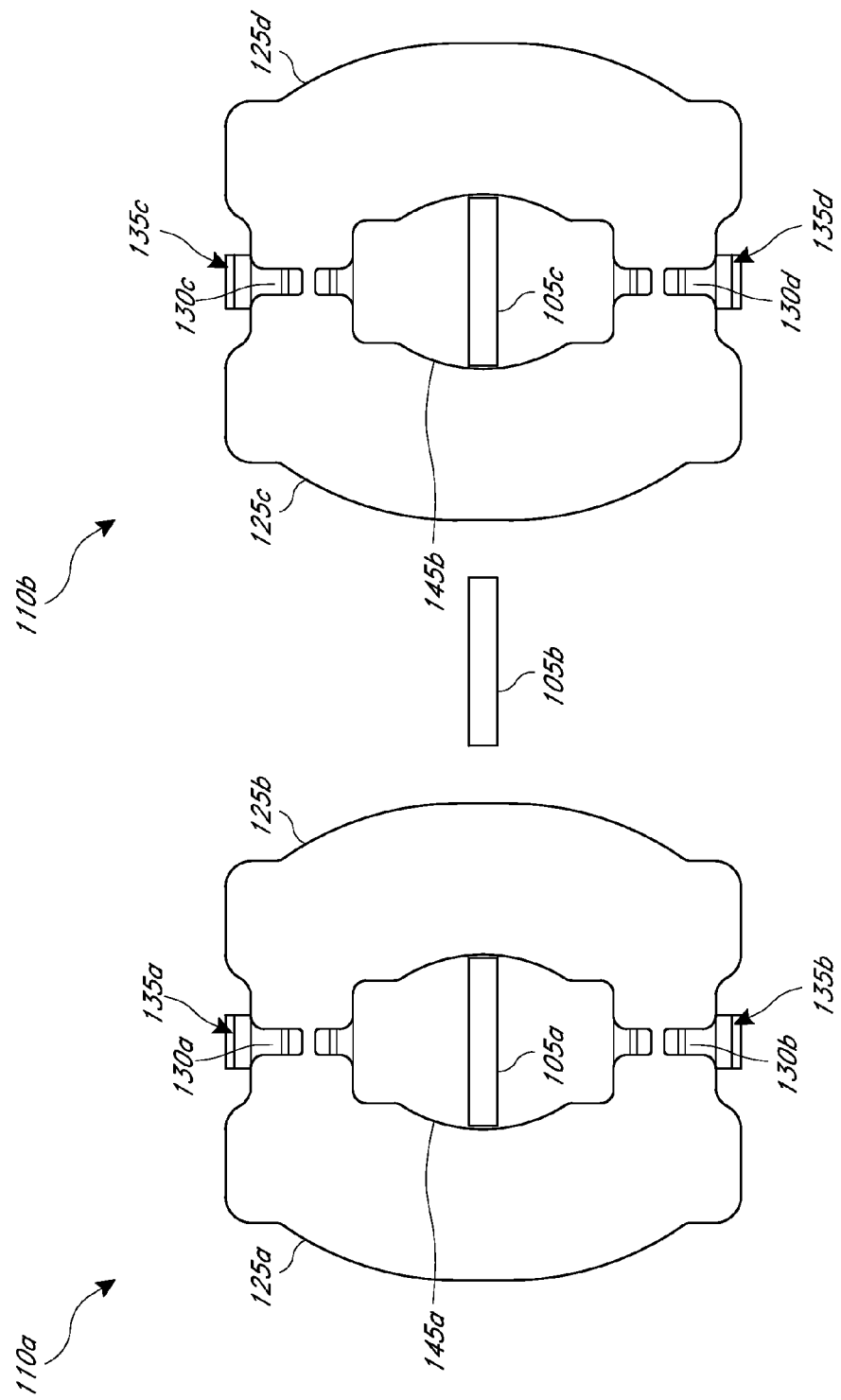
FIG. 2 illustrates an example of the conductors and current sensor positioning for the system of FIG. 1.

FIG. 1 illustrates an example three-phase conduction system 100 having dual gap current sensors 110a, 110b as described herein. The system 100 can have three conductors 105a, 105b, 105c (referred to herein as output conductors or terminals) each providing one of three phases of power. The output conductors can each define a longitudinal axis along which current flows in the respective conductor. The longitudinal axes can be substantially parallel in the area proximate to the current sensors described in more detail below. Together, the parallel axes of the conductors can define a plane within which all of the conductors reside or at least substantially reside in the area of the current sensors. Some embodiments of the system 100 can be implemented in an electric vehicle drive system, for example to provide three-phase AC power to a motor. In the depicted embodiment, conductors 105a, 105b, 105c are provided in the form of bus bars coupled to a bus bar insulation 140. FIG. 2, discussed below together with FIG. 1, illustrates an example of the conductors 105a, 105b, 105c and positioning of the current sensors 110a, 110b for the system 100 of FIG. 1.

The first conductor 105a can have a first current sensor 110a having a magnetic circuit and magnetic field detector for sensing the current flowing through the conductor 105a. The current sensor 110a can include a magnetic core formed in two magnetic circuit portions 125a, 125b with a central cavity or aperture 145a through which the conductor 105a extends. The magnetic circuit portions 125a, 125b can separated from one another by two gaps 135a, 135b. A magnetic field detector 130a, 130b, discussed herein as the example of a Hall Effect sensor, can be positioned in each of the gaps 135a, 135b. Although discussed as a gap, the separation between the magnetic circuit portions 125a, 125b may be a notch, groove, aperture, or other partial separation that provides space for the Hall Effect sensor 130a, 130b between the magnetic circuit portions 125a, 125b. The magnetic core can concentrate the magnetic field of conductor 105a which is then sensed by Hall Effect sensors 130a, 130b.

As illustrated, the third conductor 105c can have a second current sensor 110b that operates similarly to the first current sensor 110a described above to sense the current flowing through the third conductor 105c. The second current sensor 110b can include magnetic circuit portions 125c, 125d separated by gaps 135c, 135d in which are placed Hall Effect sensors 130c, 130d. The second current sensor 110b can include a central aperture 145b through which conductor 105c extends.

The system can also include current sense board 145. Current sense board 145 can be a printed circuit board or other circuit board on which electric components can be positioned for receiving and processing measurement signals from Hall Effect sensors 130a, 130b. In some embodiments, current sense board 145 can perform other functions for controlling and monitoring the current sensors 110a, 110b and/or for transmitting data to display or control units of an associated motor, for example a motor current controller. For this purpose, it is possible to provide electric terminals 120 mounted on the circuit board. In some embodiments, electric terminals 120 can be connected directly to the current sensors 110a, 110b, in order to allow the current sensors 110a, 110b to be interconnected to external electronics.

The design may further include a shield 115 (for example, a 22 gauge steel, or a layer about 0.7 mm thick) between the back (that is, facing current sense board 145) side of the current sensors 110a, 110b and the bus bar structure 140 for eliminating or mitigating remaining cross coupling effects. The shield material should have sufficient magnetic permeability to steer stay magnetic fields away from the current sensors 110a, 110b. The shield 115 is depicted between the current sensors 110a, 110b and the bus bar insulation 140. This location for shield 115 can result in good overall performance.

Although FIG. 1 depicts two current sensors 110a, 110b on two conductors 105a, 105c of three conductors 105a, 105b, 105c in a three-phase system, in other embodiments different numbers of magnetic circuits and conductors can be used, depending on the requirements of the system. For example, other systems may utilize a different number of phases and have a corresponding number of conductors. In some systems a magnetic circuit can be provided on each conductor.

Figure 3:
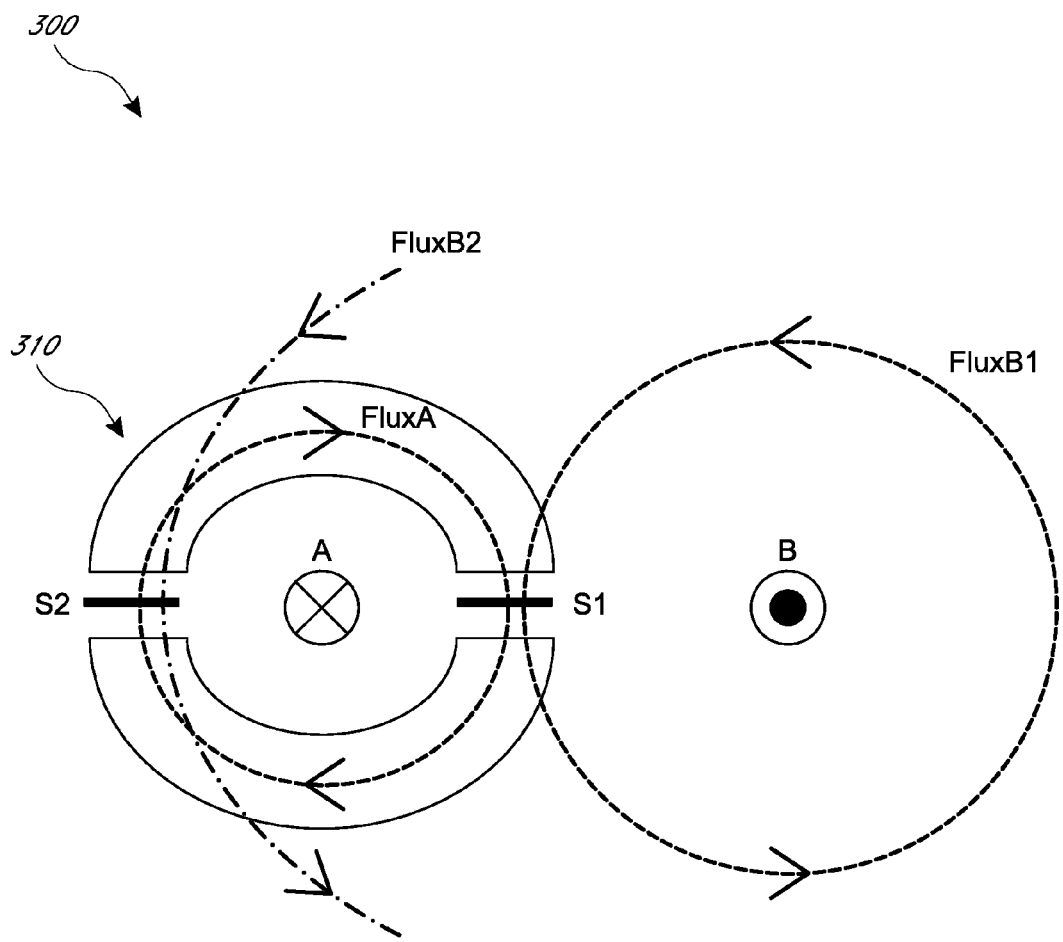
FIG. 3 illustrates an example of existing dual gap current sensor positioning.

FIG. 3 illustrates a prior current sensor design 300 in which the Hall Effect sensors and gaps of each current sensor are positioned in the same plane as the plane defined by the parallel (or substantially parallel) longitudinal axes of the output conductors A and B. Such a design can cause large cross-coupling effect between the Hall Effect sensors, and the two outputs of the sensors have significant imbalance. Previous approaches attempt to mitigate the cross coupling effects by individually calibrating the coupling coefficient of each adjacent conductor to the Hall Effect sensor. The coupling coefficients could then be stored in software and used to compute an estimate of the actual current based upon the measured values. This compensation technique theoretically works well for an ideal conduction system having infinitely long and parallel bus bars, but may be complex or not possible to achieve with more complicated three-dimensional bus bar structures, such as the structure shown in FIG. 1.

Referring again to FIG. 3 illustrates a simplified diagram of two adjacent conductors A, B. Conductor A has current flowing into the page, while conductor B has current flowing out of the page. Current sensor 310 is placed around conductor A. Conductor A generates Flux A, which is concentrated by the core of current sensor 310 and flows through the dual Hall Effect sensors S1 and S2. Conductor B generates stray fields Flux B1 and Flux B2. These stray fields are of unequal amplitude (as field strength decays as the distance from the conductor increases) and penetrate the Hall Effect sensors approximately at right angles which results in maximum coupling. The net result is that conductor B will have strong and unequal coupling to the sensors S1 and S2.

Figure 4A:
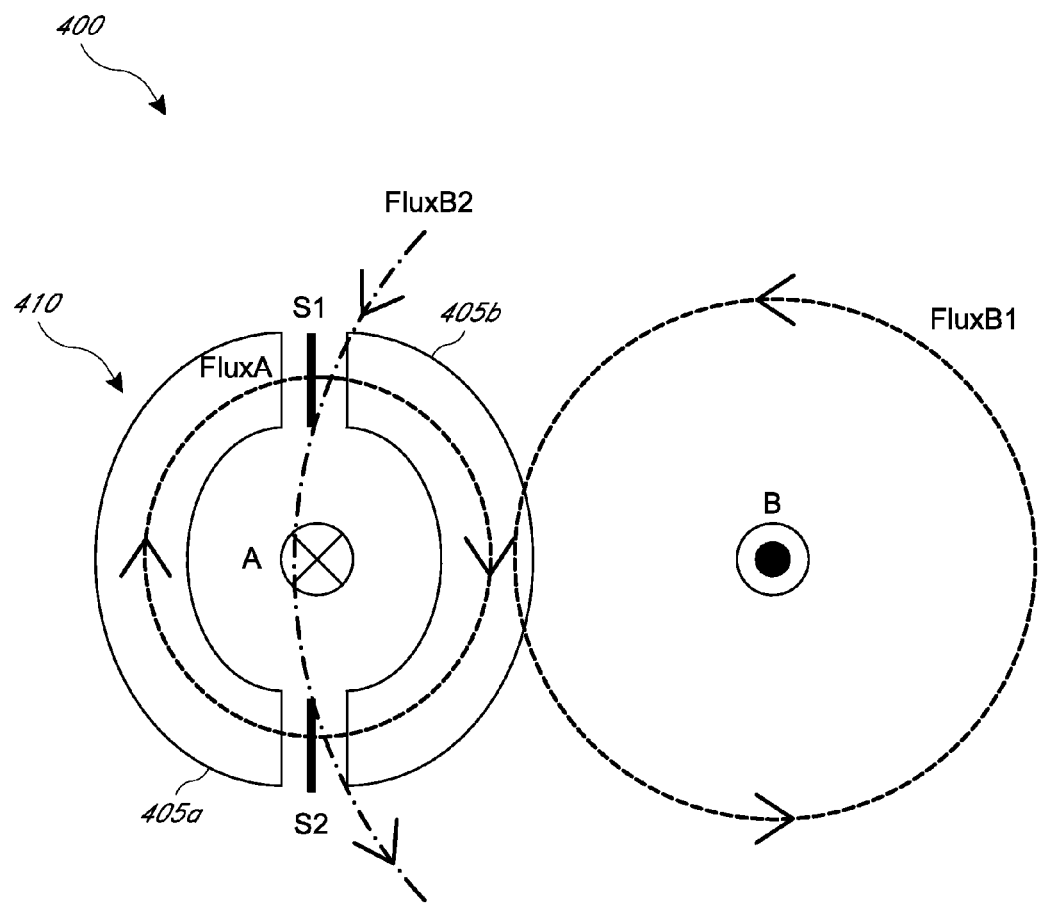
FIG. 4A illustrates an example of a dual-gap current sensor positioned to minimize error due to stray magnetic fields.
Figure 4B:
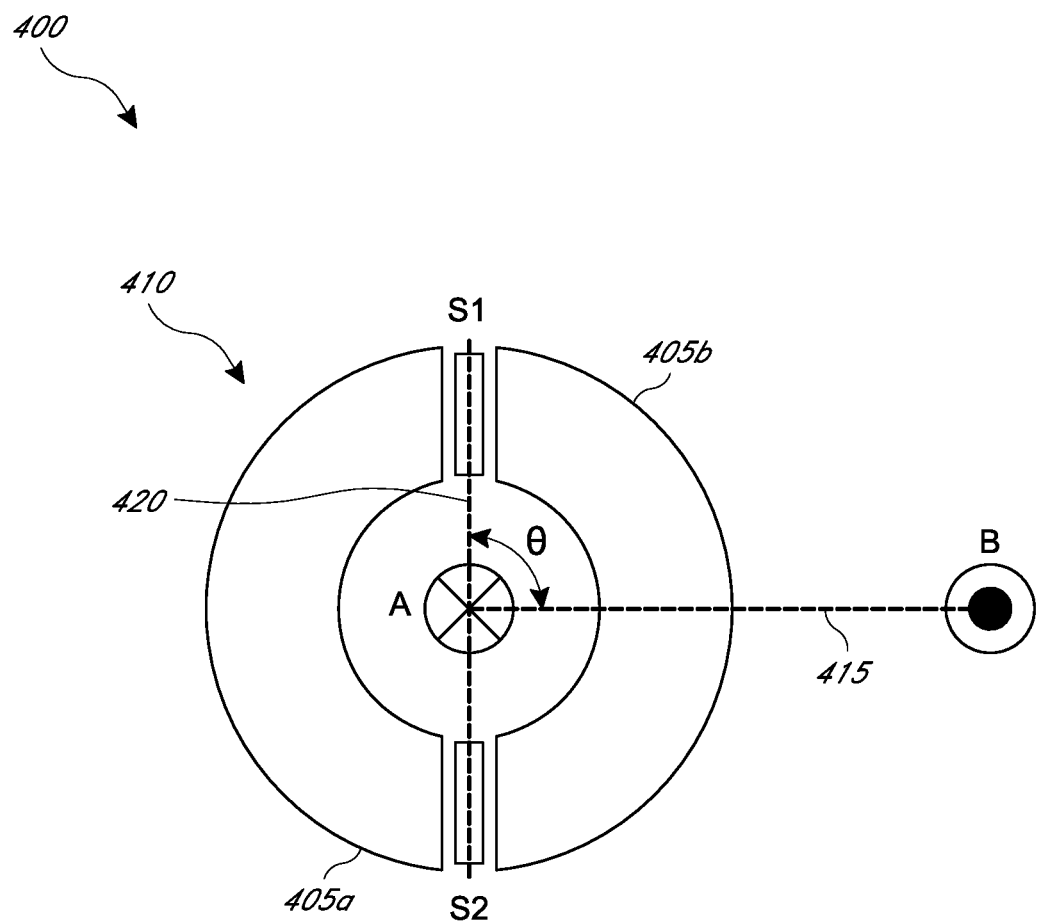
FIG. 4B illustrates further details of the example dual-gap sensor positioning of FIG. 4A.

FIGS. 4A and 4B illustrate a current sensor design 400 according to one implementation. Similar to FIG. 3, conductor A has current flowing into the page while conductor B has current flowing out of the page. Current sensor 410 can be placed around conductor A. As depicted in FIG. 4A, conductor A can generate Flux A, which is concentrated by the core of current sensor 410 and flows through the dual Hall Effect sensors S1 and S2. Conductor B can generate stray fields Flux B1 and Flux B2 that have different amplitudes based on distance from conductor B.

As depicted, the magnetic core 405a, 405b and Hall effect sensors S1, S2 can be positioned on opposite sides of the plane containing conductors A, B. Accordingly, in the design of FIG. 4A, the same amplitude flux (Flux B2) flows near the sensors S1 and S2. In addition, the stray field Flux B2 can be nearly orthogonal to the sensors S1, S2, which can reduce coupling. Additionally, the magnetic core 405a, 405b can now shunt the stray fields Flux B1, Flux B2 away from the sensors S1, S2 so coupling can be further reduced.

The design 400 minimizes the coupling to adjacent phase co-planar bus bar conductor and reduces imbalance, thereby improving measurement. Three advantages can be realized by the sensor positioning design 400. Firstly, the stray fields of adjacent conductors can become nearly orthogonal to the two Hall Effect sensors S1, S2, thus minimizing the resultant measurement pick-up. Secondly, the distance of each Hall Effect sensor S1, S2 to adjacent conductor B can be equalized, so any unintended effect will be same on both Hall Effect sensors S1, S2. Thirdly, the magnetic core 405a, 405b can now be situated to shunt away the unwanted stray fields from the Hall Effect sensor.

FIG. 4B provides further details of the positioning of the Hall Effect sensors S1, S2 relative to conductors A and B. The output conductors A and B can each define, for at least a portion of their length, substantially parallel longitudinal axes which in turn define a plane, represented by cross-section line 415. The Hall Effect sensors S1, S2 can be positioned on opposite sides of the plane As depicted, a line 420 joining the center of the first magnetic field detector S1 and the second magnetic field detector S2 forms a smallest angle θ with the plane 415. In an embodiment, the smallest angle θ is at least 60 degrees. In some embodiments, the smallest angle θ is at least 80 degrees. In some embodiments, the smallest angle θ is at least 85 degrees. As such, no magnetic field detector may be positioned directly between the first conductor A and the second conductor B. In some embodiments, the shortest distance between the center of a first one of the pair of magnetic field detectors S1 and the center of the second conductor B is approximately equal to the shortest distance between the center of a second one of the pair of magnetic field detectors S2 and the center of the second conductor B.

Although only two conductors A, B are shown, some embodiments can include additional conductors. The additional conductors may be positioned in the plane 415 or forming an additional plane together with an adjacent conductor.

Figure 5:
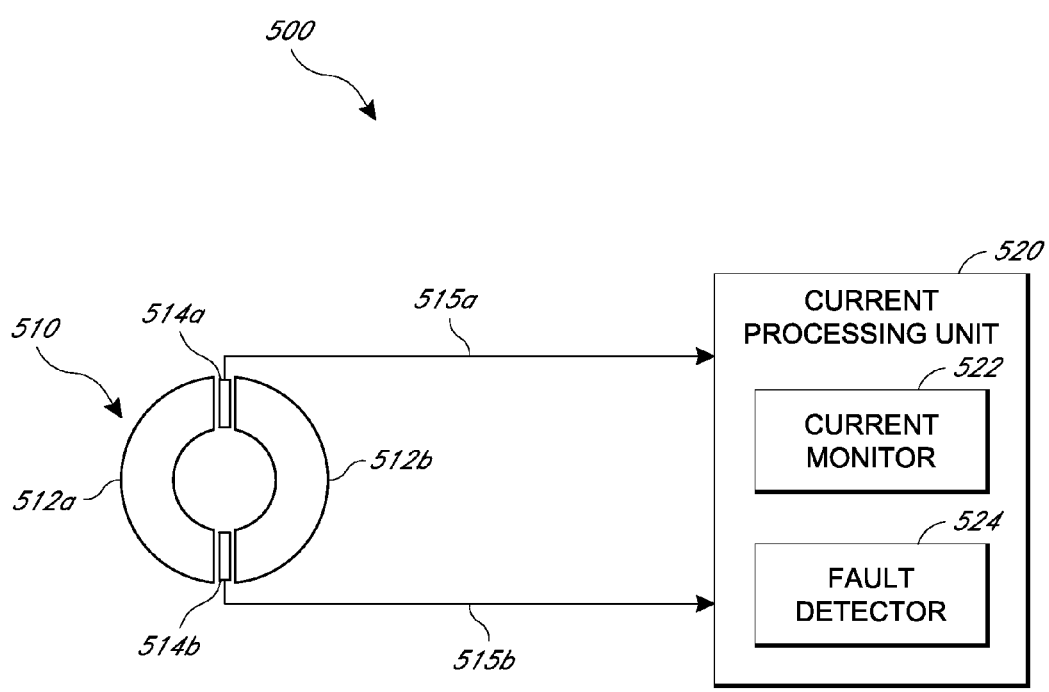
FIG. 5 depicts a schematic block diagram of an embodiment of a fault monitoring circuit.

FIG. 5 depicts a schematic block diagram of an embodiment of a fault monitoring circuit 500 that receives signals from Hall Effect sensors 514a, 514b of a current sensor 510 having two magnetic circuit portions 512a, 515b positioned according to the design 400 depicted in FIGS. 4A and 4B. Although only a single current sensor 510 is depicted in FIG. 5 for purposes of simplicity, in other embodiments the current processing unit 520 can receive signals from multiple current sensors (for example, two or three current sensors provided in a three-phase conduction system).

The Hall Effect sensors 514a, 514b are in data communication with the current processing unit 520. In some embodiments, current processing unit 520 and/or one or both of sub-units current monitor 522 and fault detector 524 can be implemented in the current sense board 145 depicted in FIG. 1. In some embodiments, current processing unit 520 and/or one or both of its sub-modules 522, 524 can be in data communication with or incorporated into a processor or controller of a vehicle drive system, for example a current controller that provides control signals to an inverter that, in turn, provides the three phases of power to the conductors 105a, 105b, 105c of FIG. 1.

Current monitor 522 can receive the signals provided by the Hall Effect sensors 514a, 514b, as well as from any other Hall Effect sensors on other conductors in a system, or can receive data representing one or more currents calculated based on the signals from the Hall Effect sensors, in order to monitor currents flowing through the conductors of the system.

Because the stray fields of adjacent conductor(s) have the same effect on the two Hall effect sensors 514a, 514b, the signals provided by the Hall effect sensors 514a, 514b should be approximately equal. These signals can be provided to fault detector 524, and fault detector 524 can execute instructions to compare the signals to one another, for example for diagnostic purposes. In response to determining that the signals provided by the Hall Effect sensors 514a, 514b are not equal (or within a threshold level from one another), the fault detector 524 can output a fault indication, for example by triggering output of a maintenance required indication presented to a user of a machine (for example, an electric vehicle) implementing the fault monitoring circuit 500, or by causing a sensor data report to be sent to a manufacturer or maintenance provider of the fault monitoring circuit 500. The sensor data report can include information relating to the determined inequality, for example the amount of inequality and the conductor and/or Hall Effect sensor(s) associated with the inequality. The diagnostic check performed using the separate outputs from Hall Effect sensors 514a, 514b can help identify system performance issues, for example whether one of the sensors is malfunctioning. Accordingly, the values output by Hall Effect sensors 514a, 514b can be used separately by fault detector 524 instead of, or in addition to, being combined into a single value representing conductor current. In some embodiments, the system may choose to enter a safe state in response to a detected malfunction of the current sensor.

Implementations disclosed herein provide systems, methods and apparatus for current sensing using a dual-gap magnetic core.

The systems and methods above have been described in general terms as an aid to understanding details of preferred embodiments of the present invention. Other preferred embodiments of the present include the described application for electric vehicles. In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application.

Additionally, the term "or" as used herein is generally intended to mean "and/or" unless otherwise indicated. Combinations of components or steps will also be considered as being noted, where terminology is foreseen as rendering the ability to separate or combine is unclear. As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise. As used herein, the term "plurality" denotes two or more. For example, a plurality of components indicates two or more components. The phrase "based on" does not mean "based only on," unless expressly specified otherwise. In other words, the phrase "based on" describes both "based only on" and "based at least on."

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims. Although a flowchart may describe the operations as a sequential process, many of the operations can be performed in parallel, or concurrently, and the process can be repeated.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed is:

1. A power supply system comprising:
    at least two output conductors, the output conductors defining substantially parallel longitudinal axes which in turn define a plane;
    a current sensor positioned around a first conductor of the at least two output conductors and comprising:
        a central aperture through which the first conductor extends,
        a first magnetic field detector, and
        a second magnetic field detector,
        wherein the first and second magnetic field detectors are positioned on opposite sides of the plane defined by the longitudinal axes of the at least two output conductors; and
    a fault detector configured to:
        receive a first signal generated by the first magnetic field detector and a second signal generated by the second magnetic field detector,
        compare the first signal to the second signal to determine whether the first signal is equal to the second signal, and
        in response to determining that the first and second signals are not equal, output a fault indication.

2. The power supply system of claim 1, comprising three output conductors.

3. The power supply system of claim 1, wherein the first and second magnetic field detectors comprise Hall Effect sensors.

4. The power supply system of claim 1, wherein a line joining the center of the first magnetic field detector and the second magnetic field detector forms a smallest angle of at least 60 degrees.

5. The power supply system of claim 4, wherein a line joining the center of the first magnetic field detector and the second magnetic field detector forms a smallest angle of at least 80 degrees.

6. The power supply system of claim 5, wherein a line joining the center of the first magnetic field detector and the second magnetic field detector forms a smallest angle of at least 85 degrees.

7. The power supply system of claim 1, comprising a magnetic shield positioned to steer stay magnetic fields away from the first and second magnetic detectors.

8. The power supply system of claim 1, further comprising a second current sensor positioned around a second conductor and comprising:
    a second central aperture through which the second conductor extends,
    a third magnetic field detector, and
    a fourth magnetic field detector,
    wherein the third and fourth magnetic field detectors are positioned on opposite sides of the plane defined by the longitudinal axes of the at least two output conductors; and
    wherein the fault detector is configured to:
        receive a third signal generated by the third magnetic field detector and a fourth signal generated by the fourth magnetic field detector,
        compare the third signal to the fourth signal to determine whether the third signal is equal to the fourth signal, and
        in response to determining that the third and fourth signals are not equal, output a fault indication.

9. A current sensing system for measuring currents flowing in a three-phase conduction system, the current sensing system comprising:
    a first magnetic circuit comprising a first circuit portion and a second circuit portion positioned around a first conductor, the first circuit portion and the second circuit portion separated by a first gap and a second gap on opposing sides of the first conductor in a direction perpendicular to a longitudinal axis of the first conductor;
    a first pair of magnetic field detectors, one magnetic field detector of the first pair disposed in the first gap and the other magnetic field detector of the first pair disposed in the second gap;
    a second magnetic circuit comprising a third circuit portion and a fourth circuit portion positioned around a second conductor, the third circuit portion and the fourth circuit portion separated by a third gap and a fourth gap on opposing sides of the second conductor in a direction perpendicular to a longitudinal axis of the second conductor;
    a second pair of magnetic field detectors, one magnetic field detector of the second pair disposed in the third gap and the other magnetic field detector of the second pair disposed in the fourth gap;
    wherein no magnetic field detector is positioned directly between the first conductor and the second conductor; and
    a fault detection circuit in data communication with the first and second pairs of magnetic field detectors and configured to:

for at least one of the first and second pairs of magnetic field detectors, compare a first signal received from the one to a second signal received from the other to determine whether the first signal is equal to the second signal, and in response to determining, for either of the first or second pair of magnetic field detectors, that the first and second signals are not equal, output a fault indication.

10. The current sensing system of claim 9, further comprising a circuit board electronically coupled to the first and second pairs of magnetic field detectors, the circuit board comprising the fault detection circuit.

11. The current sensing system of claim 9, further comprising a current controller in electronic communication with the first and second pairs of magnetic field detectors, the current controller comprising the fault detection circuit.

12. A current sensing system for measuring currents flowing in a three-phase conduction system, the current sensing system comprising:
 a magnetic circuit comprising a first circuit portion and a second circuit portion positioned around a first conductor, the first conductor located within proximity to a second conductor such that magnetic flux of the second conductor flows through the magnetic circuit;
 a first gap and a second gap separating the first circuit portion and the second circuit portion, the first gap and the second gap positioned on opposing sides of the first conductor;
 a pair of magnetic field detectors, one magnetic field detector of the pair disposed in the first gap and the other magnetic field detector of the pair disposed in the second gap, the first gap and the second gap oriented relative to the second conductor such that the same amplitude of the magnetic flux of the second conductor flows through each magnetic field detector of the pair of magnetic field detectors; and
 a fault detection circuit in data communication with the pair of magnetic field detectors and configured to:
  compare a first signal received from the one of the first pair of magnetic field detectors to a second signal received from the other of the first pair of magnetic field detectors to determine whether the first signal is equal to the second signal, and
  in response to determining that the first and second signals are not equal, output a fault indication.

13. The current sensing system of claim 12, wherein, to output the fault indication, the fault detection circuit is configured to cause output of a maintenance required indication, or to cause transmission of a sensor data report.

14. The current sensing system of claim 12, wherein the first conductor and the second conductor define longitudinal axes that in turn define a plane.

15. The current sensing system of claim 14, wherein the centers of the magnetic field detectors are located outside the plane.

16. The current sensing system of claim 15, wherein the shortest distance between the center of a first one of the pair of magnetic field detectors and the center of the second conductor is approximately equal to the shortest distance between the center of a second one of the pair of magnetic field detectors and the center of the second conductor.

* * * * *